United States Patent [19]

Feng et al.

[11] 4,204,009

[45] May 20, 1980

[54] TWO LAYER RESIST SYSTEM

[75] Inventors: Bai-Cwo Feng, Wappingers Falls; George C. Feng, Poughkeepsie, both of N.Y.

[73] Assignee: International Business Machines Corporation, Armonk, N.Y.

[21] Appl. No.: 936,434

[22] Filed: Aug. 24, 1978

Related U.S. Application Data

[62] Division of Ser. No. 865,814, Dec. 30, 1977.

[51] Int. Cl.² .......................... B05D 3/02; B05D 3/06; B05D 1/36
[52] U.S. Cl. .......................... 427/36; 427/44; 427/43.1; 427/53.1; 427/54.1
[58] Field of Search .................. 427/36, 43, 44, 53, 427/54

[56] References Cited

U.S. PATENT DOCUMENTS

| | | | |
|---|---|---|---|
| 3,669,661 | 6/1972 | Page et al. | 96/36.2 |
| 3,934,057 | 1/1976 | Moreau et al. | 427/43 |
| 4,004,044 | 1/1977 | Franco et al. | 427/43 |
| 4,024,293 | 5/1977 | Hatzakis | 427/43 |

*Primary Examiner*—James R. Hoffman
*Attorney, Agent, or Firm*—David M. Bunnell; Thomas F. Galvin

[57] ABSTRACT

A resist mask comprising two layers of resist, one of which is saturated with a dilutant which does not dissolve the other. In one embodiment, the two layers of resist are applied upon a substrate, the first layer of which is more soluble in a developer. The second layer is said saturated resist and the first layer is non-saturated. This composite is preferably used to form a relief mask with recessed sidewalls used in lift-off processes.

6 Claims, 5 Drawing Figures

TWO LAYER RESIST SYSTEM

This is a division of application Ser. No. 865,814 filed Dec. 30, 1977.

BACKGROUND OF THE INVENTION

1. Field of the Invention

This invention relates generally to resist layer structures and more particularly to high sensitivity resist layers useful in lithographic processes.

Optical or electron beam lithography is still used as the main tool in micro-circuit fabrication. It is expected to continue into the near future.

The additive metallization technique known as "lift-off" was developed with the advent of electron beam lithography in the late 1960's. It provides the metallization after the exposure and development of the resist. Basically, the lift-off technique utilizes the fact that electron scattering in the resist and back scattering from the substrate creates a tear-shaped energy absorption profile in the resist, which results in an undercut profile after resist development. In this way metal which is evaporated over the entire surface exhibits discontinuities between the metal on the substrate and the metal over the resist. During resist removal in a suitable solvent the metal over the resist is also removed and a clean and faithful reproduction of the image is obtained in metal. An additional advantage of the lift-off technique is that multi-level metal structures can be formed because any material or combination of materials that can be evaporated can be used.

One of the principal reasons for the success of the lift-off process in electron beam lithography is the fact that the energy absorption in the resist film during exposure is not linear but reaches a maximum in about two-thirds of the beam penetration range. Thus, with proper exposure and development, undercut resist profiles are easily obtainable.

In the optical exposure of photoresist, however, energy absorption is highest at the top of the resist film and lowest at the interface between the resist and the substrate due to the attenuation of the light in the resist. Moreover, standing waves created by the light reflected from the substrate are a further complication. These exposure conditions make it impossible to obtain undercut or even vertical resist profiles with normal UV exposure of AZ type positive photoresist.

Another technique which has been successfully in electron beam lithography to increase resist sensitivity, while maintaining the undercut feature of the developed resist, comprises the coating of two or more resist layers having widely different solubilities. After electron beam exposure, a developer is chosen which develops the top layer at least ten times slower than the bottom layer. Alternatively, two mutually exclusive developers can be used for the successive development of the two layers. Both of these approaches result in resist profiles suitable for lift-off metallization.

With resists which can be used with both electron beam as well as optical exposure systems, however, it is difficult to spin-coat two distinct layers without excessive interaction at the interface, due to the low prebake temperature allowed for these resists between coatings. Electron resists such as polymethylmethacrylate (PMMA) can be baked at up to 170° without deterioration; however, an AZ-type resist which is suitable for both optical and electron beam exposure cannot be baked above about 100° C. At this low temperature the resist film retains its solubility in various solvents and can therefore be easily dissolved by the application of the second layer.

Therefore, based on results with E-beam type resists, it has been well known that the application of two layers of standard photoresist, of which the first layer is more soluble in a developer, could be used to form a relief mask with recessed sidewalls for a lift-off process. This type of structure could be made in several ways: (1) by reducing the sensitizer concentration in the lower part; (2) by use of a resin having a higher molecular weight than the lower part of the resist structure which develops faster than the upper portion; or (3) by use of a sensitizer in the lower part of the structure which is less resistant to the developer in the case of positive resist.

However, as previously mentioned, if the second layer of an optical resist is directly applied on the first layer prior to exposure, the layers dissolve and mix with each other. If the first layer is baked at high temperature to avoid this dissolution, the first layer hardens and becomes insoluble in the developer.

One successful lift-off process using standard optical-type resists is described in the patent issued in the names of Franco et al, U.S. Pat. No. 4,004,044 and entitled "Method for Forming Pattern Films Utilizing a Transparent Lift-Off Mask". The method comprises depositing an organic polymer masking layer, such as AZ-1350 type resist, atop a substrate. After baking to improve adhesion and thermal stability, a separate glass resin layer is spun on over the resist. A second masking layer which may also be AZ-1350 is then spun on the resist layer. The second masking layer is patterned and windows are opened in the glass layer and the first masking layer by reactive sputter etching using two gases. The second reactive sputter step is continued until the edges in the openings through the glass material overhang the edges in the openings through the first AZ-1350 layer, thereby forming a lift-off mask. Although the Franco et al technique is very effective in providing usable lift-off masks, it is complicated by the need for the glass resin layer, reactive sputter etching and relatively high temperature. A simpler process is desirable.

SUMMARY OF THE INVENTION

It is therefore a principal object of our invention to form a composite resist structure using conventional photoresists.

It is a further object of our invention to provide said resist structure for an improved lift-off process.

It is another object of our invention to provide said resist structure to yield other selectable resist profiles.

It is yet another object of our invention to provide such a structure which is applicable in low-temperature processes.

These and other objects of our invention are achieved with a novel resist film having two layers, one layer being a standard resist material and the other layer being the same or another standard resist material which is saturated with a dilutant.

For a lift-off process, the lower layer is the standard resist and is prepared so as to be more soluble in the resist developer than the upper, saturated layer. When exposed and developed, the upper layer overhangs the lower layer.

Most photoresist materials comprise three principal parts: a sensitizer, a resin and one or more solvents.

Each solvent has a maximum solubility for a particular material and several solvents can be used in a photoresist as a solvent system which offers maximum solubility for the sensitizer and resin. When these solids dissolved in the solvent system achieve maximum solubility, i.e., saturation, we have found that this photoresist does not dissolve an underlying photoresist of the same or similar material. However, this type of system is not feasible because it is extremely thick, making it difficult to prepare and too viscous to handle and apply.

We have found that a saturated solution which does not have the above-mentioned difficulties can be formed by saturating the resist system with a material which is a non-solvent for the sensitizer and resin in the photoresist and which is mixable with the solvents in the photoresist. In the art, such a non-solvent material is called a dilutant.

In one preferred embodiment a dilutant such as xylene is mixed with a standard resist solution containing a phenol formaldehyde resin and a diazo oxide sensitizer to the saturation point. When this solution is deposited atop a layer of the standard pre-baked resist, the layers do not substantially interact.

Our process is particularly effective in the lift-off fabrication of Josephson thin film devices where low temperature resist processes are imperative. In Josephson devices, fabrication temperatures of greater than around 70° C. will damage the oxide layer, which is only 50 Å thick. Moreover, the metallization of the device, designed as it is for operation at cryogenic levels, is also susceptible. Our process allows one to use resists which can be effectively used at bake temperatures of 70° C. or lower.

DESCRIPTION OF THE PREFERRED EMBODIMENTS

Figure 1A:
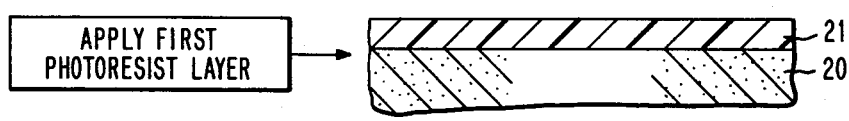
FIGS. 1A-1E are diagrammatic cross-sectional views of a metallization process using the lift-off technique in which the photoresist layers are provided in accordance with our invention. The figures also include a flow chart describing the steps.

FIGS. 1A-1E illustrate the formation of the composite mask in accordance with the method of our invention as well as the utilization of this novel composite mask for lift-off type purposes. With reference to FIG. 1A, an organic polymeric masking layer 21 is formed on substrate 20. Preferably, layer 21 comprises a positive resist such as AZ-1350J type polymer which is pre-baked to improve adhesion to substrated 20. The thickness of layer 21 determines the maximum thickness of the functional film that can be lifted off upon removal of layer 21. Typically layer 21 is from 10,000 Å to 20,000 Å thick.

In the fabrication of integrated circuits, substrate 20 may be a semiconductor material or a semiconductor substrate having a surface layer of electrically insulative material, such as silicon dioxide.

The preferred organic polymeric masking material AZ-1350J comprises a novolak-type phenol-formaldehyde resin and a diazo oxide photosensitive compound dissolved in AZ thinner. The result is commerically available from the Shipley Corporation. Other suitable photoresist materials include diazo type photoresist and others as well as negative resists such as KTFR available from the Kodak Corporation, and resins such as polyvinyl cinnamate polymers.

Figure 1B:
Figure 1C:
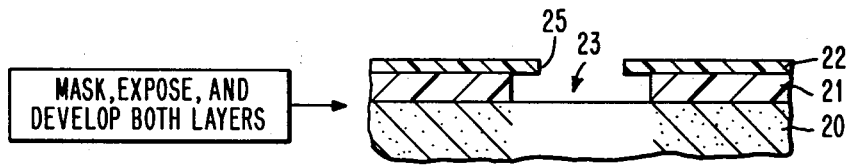
Figure 1D:
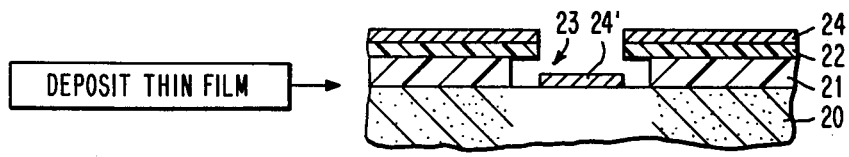

As illustrated in FIG. 1D a layer of saturated resist 22 is spun onto layer 21. In the case of using AZ-1350J or the like as the underlayer 20, it is preferable to also use AZ-1350J or the like as the top layer. The saturating material, i.e. the dilutant, may be either xylene, toluene, chlorobenzene or freon fluorinated hydrocarbons.

The saturated resist 22 contains a greater amount of the photosensitive agent or has a greater molecular weight than resist 21. Either property makes layer 22 less sensitive to the developer than layer 21.

As illustrated in FIG. 1D, the layer of the saturated resist 22 is spun on to layer 21. Typically the saturated layer is from between 3000 to 3500 Å thick. The substrate is then pre-baked and the two layers 21 and 22 mix slightly. However, because layer 22 is saturated the mixing is not substantial.

Openings such as opening 23 are produced in layers 22 and 21 by conventional lithographic techniques such as optical or electron beam exposure. Because of the lesser sensitivity to the developer of upper layer 22 as compared to the lower layer 21 the latter tends to etch faster in the developer, thereby yielding the lift-off structure with overhang 25. Overhang 25 in layer 22 permits considerable "overetching" of layer 21 to assure that all of the material of layer 21 has been removed in the locations of the desired opening 23. Additionally, the overhang aids in the elimination of "edge tearing" when the thin film material is lifted off in subsequent steps of the process. The pattern dimensions of the functional thin film material to be deposited on substrate 20 through openings 23 are determined by the overhang aperture size in layer 22.

Next, using the lift-off composite structure of FIG. 1C, a functional metallic film 24 is deposited over the structure as shown in FIG. 1D. This metallic film may be any metal used for integrated circuit metallization, for example, aluminum, aluminum-copper alloys, aluminum-copper-silicon alloys, palladium, chrome, platinum tantalum, etc. Layer 24 may also be an insulator such as silicon dioxide or silicon nitride.

Figure 1E:
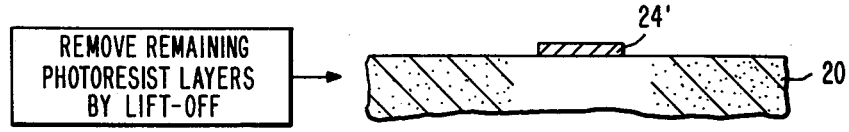

In the final step of the lift-off process photoresist layer 21 is completely removed by immersion into a solvent, such as acetone or J100 photoresist solvents for about 15 to 30 minutes which leaves thin film layer 24' in the desired pattern configuration as shown in FIG. 1E. The solvent selected should be one which dissolves or swells the polymeric material of layer 21 without affecting thin film 24'. Such solvents also include NMP, methylethylketone or trichloroethylene. The solvents used to dissolve the polymeric material may be the same solvents used in applying the polymer coating 21.

EXAMPLE 1

A positive resist material is fabricated with phenol formaldehyde novalak resin and a diazo ketone sensitizer, which is commercially available from the Shipley Company as AZ1350J. The sensitizer is believed to be 4'-2'-3'-dihydroxy-benzophenone mixed esters of 1-oxo-2-diazo-naphthalene-5-sulfonic acid. Other sulfonated esters of dihydroxybenzophenone could also be used. These solids are dissolved in ethyl cellosolve acetate, or AZ thinner which contains 82.6% ethyl cellosolve acetate, 8.8% N-butyl-acetate and 8.6% xylene.

This dissolved resist solution is then mixed with a dilutant such as xylene, toluene, chlorobenzene or freon. The dilutant is added to the dissolved resist gradually by mechanical stirring or agitation. At a concentration of around two parts xylene and one part dissolved resist solution, sufficient solids including the resist resin and sensitizer precipitate. The entire mixture is then filtered through sub-micron filters, with the filtered mixture being termed saturated resist.

In the process for forming the composite layer, the substrate is precleaned, treated with a surface adhesion promoter such as HMDS, and the resist material without said dilutant is applied thereon to a thickness of around 18,000 Å. The resist is prebaked at 70° to 100° C. for ten to fifteen minutes.

Said saturated resist is then spun on the original resist to a thickness of around 1200 Å as layer 22. The prebaking step is repeated, whereby the composite resist structure appears as shown in FIG. 1B ready for use.

After this second pre-baking step the thickness of layer 22 is increased from about 1200 Å to around 3000 Å by its interaction with layer 21. However, this has no significant effect on the further processing because of the thickness of layer 21. Application of AZ1350J typically yields a resist layer which is around 18,000 Å thick. Even with the dilution of 3 parts AZ1350J with 1 part AZ therein, layer 21 is still around 12,000 Å thick.

In the case where the liftoff structure shown in FIG. 1C is desired, layer 21 is formulated to be faster dissolving in resist developer than layer 22. This is best accomplished by formulating resist 21 to have a lower molecular weight than resist 22. The resist described in U.S. Pat. No. 3,666,473, issued in the names of Colom and Levine, is suitable as layer 21. Alternatively, the concentration of sensitizer in layer 21, as compared to that in layer 22, may be reduced. This is best accomplished by using standard AZ1350J resist as layer 21 and adding a quantity of said sensitizer to another portion of AZ1350J for fabricating said saturated resist as layer 22. For example, 20 gm. sensitizer is dissolved in 80 gm solvent. This solution is added to 20 ml. AZ1350J so that a resist solution is formed which is then saturated with xylene. This is applied as layer 22.

Layer 22 is masked so as to define the desired pattern of openings and is exposed to an actinic light source of between 2000–4000 Å. The exposed areas are then dissolved in an alkaline developer, viz. AZ developer, to yield the structure shown in FIG. 1C.

EXAMPLE 2

By adding four parts xylene to one part dissolved resist solution, more solids are caused to precipitate. The resulting saturated resist is thinner than the 2:1 saturated resist in Example 1. When applied atop the standard resist, the thickness of the saturated resist layer is reduced to around 600 Å; in addition, there is less interaction between the two resist layers.

EXAMPLE 3

The application of more than one coat of saturated resist is beneficial in controlling the resist profile obtained after exposure. For example, a thin saturated resist layer fabricated as in Example 2 may be applied first atop the standard resist layer 21. This is followed by one or more coats of the saturated resists fabricated as in Example 1 or 2 to yield a saturated resist composite layer of a desired thickness.

EXAMPLE 4

A negative resist material is fabricated with a resin of poly-cis-isoprene cyclized rubber and a sensitizer which is 2,6-bis (p-azidobenzylidene)-4-methylcyclohexane. These solids are dissolved in xylene.

A portion of the dissolved resist solution is then mixed with a dilutant of Freon which is carried in cellosolve acetate in a ratio of 1:1. This is added to the dissolved resist gradually by mechanical stirring or agitation. At a concentration of around one part dilutant-cellosolve acetate solution and one part dissolved resist, solids including the resist resin and sensitizer precipitate. The entire mixture is then filtered through sub-micron filters, with the filtered mixture being saturated resist.

In the process for forming the composite layer, the substrate is pre-cleaned, treated with a surface adhesion promoter such as HMDS, and the remaining portion of the original resist material is applied thereon. The resist is prebaked at 80° to 100° C. for ten to fifteen minutes. Said saturated resist is then spun onto atop the unsaturated resist.

The prebaking step is repeated, whereby the composite resist structure is ready for use in a resist mask.

The composite is masked so as to define the desired negative pattern of openings and is exposed to an actinic light source of between 2000–4000 Å. The unexposed areas are then dissolved in xylene developer to yield the patterned mask.

In conclusion, our invention provides a means for forming a mask of a plurality of layers of photoresist without significant interaction among the plural layers. Various patterned resist profiles are thereby achievable by providing for a slower dissolving rate in resist developer in selected resist layers of the composite. In particular, the invention yields a desirable profile which is undercut to aid in establishing a discontinuity between the portions of added layers which are applied to the upper surfaces of a resist and the portions of the layer which are directly attached to the substrate. This result is obtained by the faster dissolution of the underlying resist layer in the developer. Because our process is applicable to the types of resist which do not require high temperature baking, our invention is very effective in the formation of devices which require low temperature processes, such as Josephson type devices. This is discussed merely by way of example and is not intended to limit our invention. Clearly, it is also applicable to the formation of standard integrated circuit structures as well as to more advanced technologies such as bubble memories.

While the invention has been particularly shown and described with reference to preferred embodiments thereof, it will be understood by those skilled in the art that the foregoing and other changes in form and detail may be made without departing from the spirit and scope of the invention.

I claim:

1. In a method for forming a lift-off resist mask comprising:
   coating on a substrate a first layer of resist material,
   coating on said first layer a second layer of resist material which is slower dissolving in resist developer than said first layer of resist material after exposure of both layers to actinic radiation each resist material being a sensitized organic polymer capable of forming a patterned resist mask to protect the underlying portions of a substrate,
   exposing portions of said layers to actinic radiation and developing to remove the exposed portions of said layers to uncover said substrate by treating said layers with a solvent which preferentially dissolves the exposed portions, the improvement wherein:

said second layer is formed from a resist material solution which is saturated with a dilutant which does not substantially dissolve said first layer.

2. A method as in claim 1 wherein the polymer of said second layer has a higher molecular weight than the polymer of said first layer.

3. A method as in claim 1 wherein each resist material contains a sensitizer and the resist material of said second layer contains greater proportion of sensitizer than the resist material of said first layer.

4. A method as in claim 1 further comprising the steps of:

baking said first and second layers at a low temperature so as to expel retained solvents and harden said layers prior to exposing.

5. A method as in claim 4 wherein said resist layers include a phenol formaldehyde resin and said baking temperature is around 70° C.

6. A method as in claim 1 further comprising:

coating on said second layer at least one other layer of resist, said other layer formed from a resist solution which is saturated with said dilutant.

* * * * *